(12) United States Patent
Pietambaram et al.

(10) Patent No.: US 11,735,531 B2
(45) Date of Patent: *Aug. 22, 2023

(54) PANEL LEVEL PACKAGING FOR MULTI-DIE PRODUCTS INTERCONNECTED WITH VERY HIGH DENSITY (VHD) INTERCONNECT LAYERS

(71) Applicant: Intel Corporation, Santa Clara, CA (US)

(72) Inventors: Srinivas V. Pietambaram, Gilbert, AZ (US); Sri Ranga Sai Boyapati, Chandler, AZ (US); Robert A. May, Chandler, AZ (US); Kristof Darmawikarta, Chandler, AZ (US); Javier Soto Gonzalez, Chandler, AZ (US); Kwangmo Lim, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 100 days.

This patent is subject to a terminal disclaimer.

(21) Appl. No.: 17/374,886

(22) Filed: Jul. 13, 2021

(65) Prior Publication Data

US 2021/0343653 A1 Nov. 4, 2021

Related U.S. Application Data

(63) Continuation of application No. 16/326,679, filed as application No. PCT/US2016/054559 on Sep. 29, 2016, now Pat. No. 11,101,222.

(51) Int. Cl.
*H01L 23/538* (2006.01)
*H01L 23/00* (2006.01)

(52) U.S. Cl.
CPC .......... *H01L 23/5389* (2013.01); *H01L 23/00* (2013.01); *H01L 24/06* (2013.01);
(Continued)

(58) Field of Classification Search
None
See application file for complete search history.

(56) References Cited

U.S. PATENT DOCUMENTS 11,101,222 B2 * 8/2021 Pietambaram .......... H01L 24/06
2013/0288428 A1 10/2013 Oda et al.
(Continued)

FOREIGN PATENT DOCUMENTS

JP 2014-003336 1/2014
JP 2014-056924 3/2014

OTHER PUBLICATIONS

International Search Report and Written Opinion for International Patent Application No. PCT/US2016/054559 dated Jun. 26, 2017, 14 pgs.

(Continued)

*Primary Examiner* — Nduka E Ojeh
(74) *Attorney, Agent, or Firm* — Schwabe, Williamson & Wyatt, P.C.

(57) ABSTRACT

A foundation layer and methods of forming a conductive via are described. A die pad is formed over a die. A seed layer is deposited over the die pad and the foundation layer. A first photoresist layer is deposited over the seed layer, and the first layer is patterned to form a conductive line opening over the die pad. A conductive material is deposited into the conductive line opening to form a conductive line. A second photoresist layer is deposited over the first layer, and the second layer is patterned to form a via opening over the conductive line. The conductive material is deposited into the via opening to form the conductive via, where the
(Continued)

conductive material only deposits on portions of exposed conductive line. The second and first layers are removed. Portions of exposed seed layer are recessed, and then a top surface of the conductive via is exposed.

5 Claims, 10 Drawing Sheets

(52) U.S. Cl.
CPC ...... *H01L 2224/04105* (2013.01); *H01L 2224/18* (2013.01); *H01L 2224/24137* (2013.01); *H01L 2924/18162* (2013.01)

(56) References Cited

U.S. PATENT DOCUMENTS

| | | | |
|---|---|---|---|
| 2014/0103488 A1* | 4/2014 | Chen | ............ H01L 24/19 257/532 |
| 2014/0159228 A1 | 6/2014 | Teh | |
| 2016/0071829 A1 | 3/2016 | Yu et al. | |
| 2016/0254168 A1* | 9/2016 | Liu | ............ H01L 21/486 438/107 |
| 2017/0162806 A1 | 6/2017 | Han | |
| 2018/0068978 A1 | 3/2018 | Jeng | |

OTHER PUBLICATIONS

International Preliminary Report on Patentability for International Patent Application No. PCT/US2016/054559 dated Apr. 11, 2019, 11 pgs.

\* cited by examiner

PANEL LEVEL PACKAGING FOR MULTI-DIE PRODUCTS INTERCONNECTED WITH VERY HIGH DENSITY (VHD) INTERCONNECT LAYERS

CROSS-REFERENCE TO RELATED APPLICATIONS

This patent application is a continuation of U.S. patent application Ser. No. 16/326,679, filed Feb. 19, 2019, entitled "PANEL LEVEL PACKAGING FOR MULTI-DIE PRODUCTS INTERCONNECTED WITH VERY HIGH DENSITY (VHD) INTERCONNECT LAYERS," which is a U.S. National Phase Application under 35 U.S.C. § 371 of International Application No. PCT/US2016/054559, filed Sep. 29, 2016, entitled "PANEL LEVEL PACKAGING FOR MULTI-DIE PRODUCTS INTERCONNECTED WITH VERY HIGH DENSITY (VHD) INTERCONNECT LAYERS," which designates the United States of America, the entire disclosures of which are hereby incorporated by reference in their entirety and for all purposes.

FIELD

Embodiments relate to manufacturing of semiconductor devices. More particularly, the embodiments relate to a panel level packaging for multi-die products interconnected with high density interconnect layers.

BACKGROUND

To meet the demand for miniaturization of form factors and high performance integration, electronic packaging technologies have provided complex packaging solutions. One electronic packaging technology is die partitioning. Die partitioning enables miniaturization of small form factors and high performance without yield issues. Die partitioning, however, requires fine die-to-die interconnections.

Prior packaging solutions for high density die-to-die interconnections have been used. One type of prior packaging solution is a multichip module (MCM). Disadvantages of the MCM are its relatively large footprint, high cost, and performance limitations. Another type of prior packaging solution is silicon interposers which include metal vias. A major disadvantage of silicon interposers is its high cost premium. Other disadvantages of silicon interposers are its inferior dielectric properties compared to organic packaging. Moreover, it is difficult to balance z-height and cracking risks with silicon interposers.

An alternative type of prior packaging solution is an embedded die architecture. Embedded die architecture provides a system-in-package (SiP) architecture with high levels of integration. Embedded die packaging solutions have higher levels of integration compared to the MCM and at a much lower cost than the silicon interposers. Two types of embedding die packaging solutions are a fan-out wafer level packaging (FO-WLP) and an embedded wafer level ball grid array (eWLB). These two types of packaging solutions have a high volume production in the market. These two packaging solutions are, however, wafer-based and costly to adopt in a wider market.

Switching from a wafer format (e.g., FO-WLP) to a panel format (e.g., fan-out panel level packaging (FO-PLP)) may result in reduced manufacturing costs and increased productivity due to higher efficiency and economies of scale. A disadvantage, however, of this panel format is its resolution limitations, which limit the ultra-fine line spacing (uFLS) of the routing layers that are needed for die-to-die interconnections.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
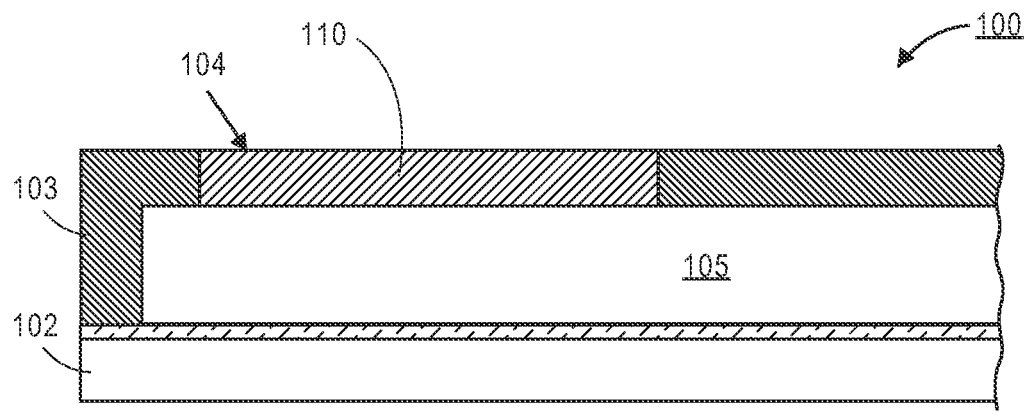
FIGS. 1-12 are cross-sectional views of a method of forming a conductive via in a foundation layer, according to one embodiment.

Described below are ways for forming ultra-fine line spacing (uFLS) routing layers for die-to-die interconnections using panel level packaging. Methods of forming a conductive via are described that are applicable for electrical packaging technologies involving uFLS routing layers for die-to-die interconnections in a fan-out panel level packaging (FO-PLP) process. For one embodiment, a foundation layer is described that includes a conductive via formed using a lithographically defined process to enable high density routing.

Embodiments of the foundation layer enhance packaging solutions. In addition, embodiments of the foundation layer help to enable uFLS for Very High Density (VHD) routing between multi-die products, especially in an embedded die-to-die architecture. Embodiments of the foundation layer utilize FO-PLP based embedded die architecture with lithographically defined vias to help achieve fine die-to-die interconnections and high density routing.

Embodiments of the foundation layer help to facilitate the forming of copper pillars (also referred to as conductive vias) over the embedded dies. These copper pillars help to enable high density interconnect layers used to fan-out die with bump pitches too dense for current panel level packaging technologies.

FIGS. 1-12 are cross-sectional views of a method of forming a conductive via with a lithographic patterning process. As used herein, the "lithographic patterning process" may refer to a process used to form a conductive via (or a pillar). Using the lithographic patterning process described herein, the conductive via formation replaces the laser drilling of vias with an alternative process that relies on lithographic patterning to define the conductive vias. Implementing the lithographic patterning process, the via (or pillar) size can be made much smaller than existing advanced laser-drilled vias, and there is no desmear that increases via size as in laser-drilled vias. Lithographic patterning described herein enables better alignment as the alignment is between litho-to-litho (as described below) compared to laser-to-litho in case of laser drilled vias. Smaller via size combined with better alignment between vias/pillars and underlying pads result in an improvement to packaging solutions by providing increased high routing density.

In addition, the lithographic patterning process provides a process flow that is used to form lithographically defined vias. The lithographic patterning process described herein enables fine die-to-die interconnections and high density routing (e.g., a VHD routing layer(s)) on a single layer or multiple layers (e.g., a foundation layer). The lithographic patterning process is also used to form uFLS routing layers for embedded die-to-die interconnections using a FO-PLP process. As used herein, the "VHD routing layer" refers to an input and output (TO) density associated with a substrate layer, where the IO density is defined as IO per millimeters per layer (IO/mm/Layer). Further, as used herein, the VHD routing layer refers to an IO density that is greater than 75 IO density (i.e., 75 IO/mm/Layer).

Figure 18:
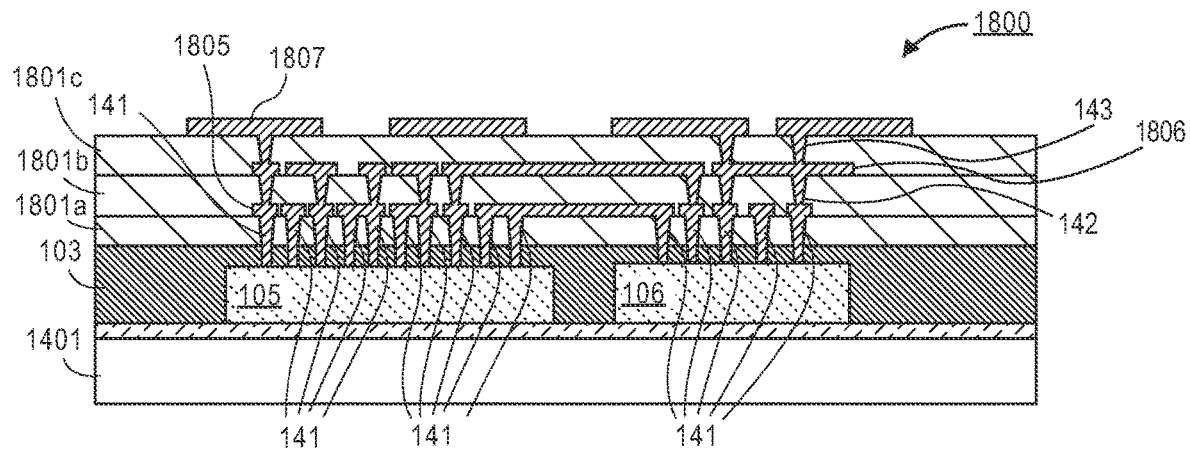
Figure 19:
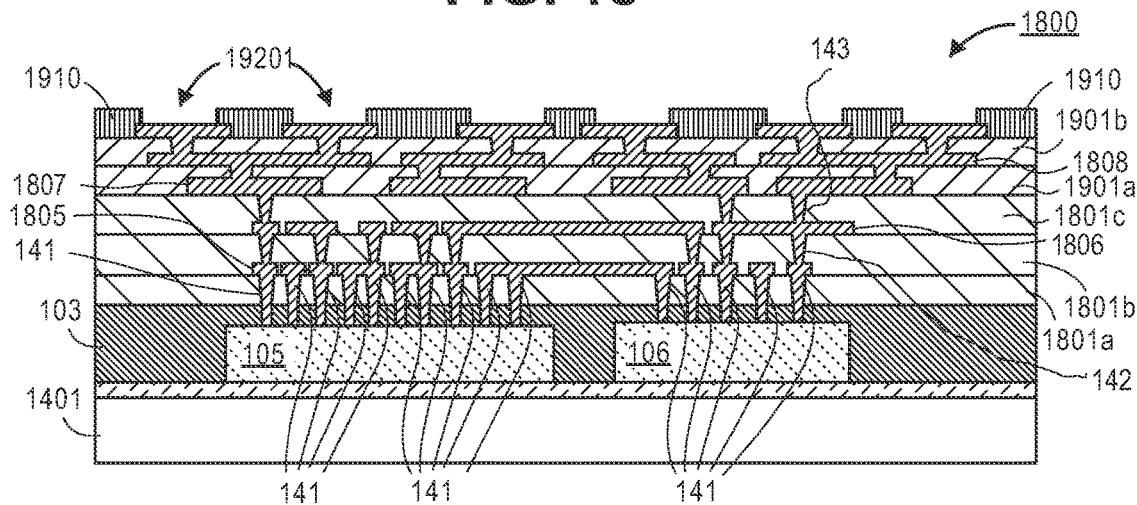
Figure 20:
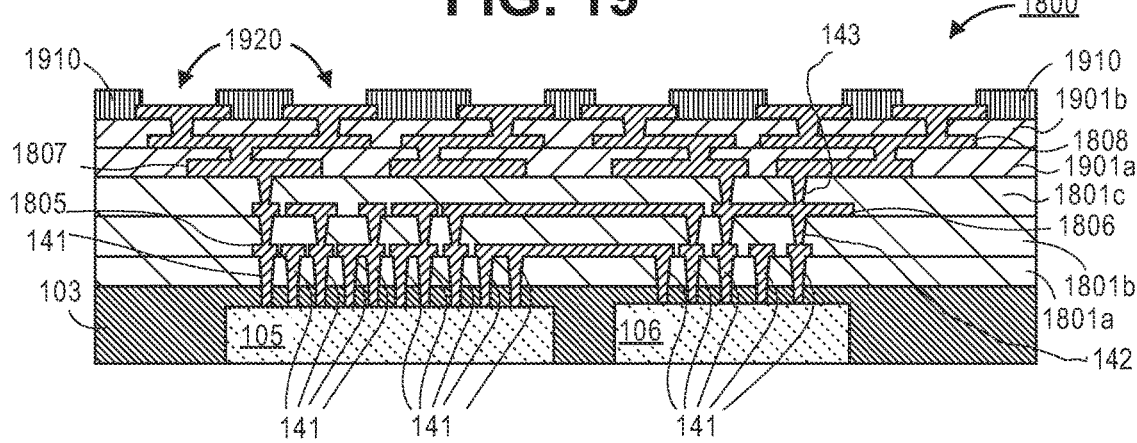

FIGS. 1-12 illustrate a method for forming a high density routing layer (e.g., uFLS) in a foundation layer to create fine die-to-die interconnections (as shown in FIGS. 18-20) using, for example, a double lithography patterning process (or a double lithography patterning/plating process). As used herein, the "double lithography pattering process" refers to a first photoresist deposited and patterned over a seed layer (i.e., a first litho-plate), and a second photoresist deposited and patterned over the first photoresist (i.e., a second litho-plate), where both photoresist form a via opening used to form a conductive via, as described herein. The double lithography pattering process results in a litho-to-litho patterning process as shown in FIGS. 3-6.

Referring now to FIG. 1, foundation layer 100 includes die pad 110, die 105, adhesive layer 102, and molding layer 103. For one embodiment, die pad 110 is formed over die 105 in foundation layer 100. Foundation layer 100 may include a packaging substrate and a printed circuit board. Foundation layer 100 may have a single layer or multiple layers. Foundation layer 100 may also include a plurality of dies that are interconnected with high density (e.g., uFLS) routing.

For one embodiment, the first layer has die 105 formed/placed over adhesive layer 102 in foundation layer 100. For one embodiment, adhesive layer 102 is a double-sided release tape. Adhesive layer 102 may be formed on a rigid carrier (not shown), which can be made from a stainless steel. Adhesive layer 102 has a thermal releasable side and a pressure sensitive adhesive side. For one embodiment, foundation layer 100 is formed with the thermal releasable side on the carrier, as the thermal releasable side can be released subsequently using a simple heat treatment. For another embodiment, adhesive layer 102 may also include other type of tapes such as a UV releasable tape on a glass carrier.

Molding layer 103 is formed over die pad 110, die 105, and adhesive layer 102. For one embodiment, molding layer 103 is made of epoxy with filler material. Molding layer 103 helps to protect and cover die 105 from corrosion and damage. Molding layer 103 is then recessed to expose top portion 104 of die pad 110. For one embodiment, molding layer 103 is recessed using a mold grinding/polishing. Polished surface also provides a flat surface which improves the resolution of the subsequent lithography process.

Figure 2:
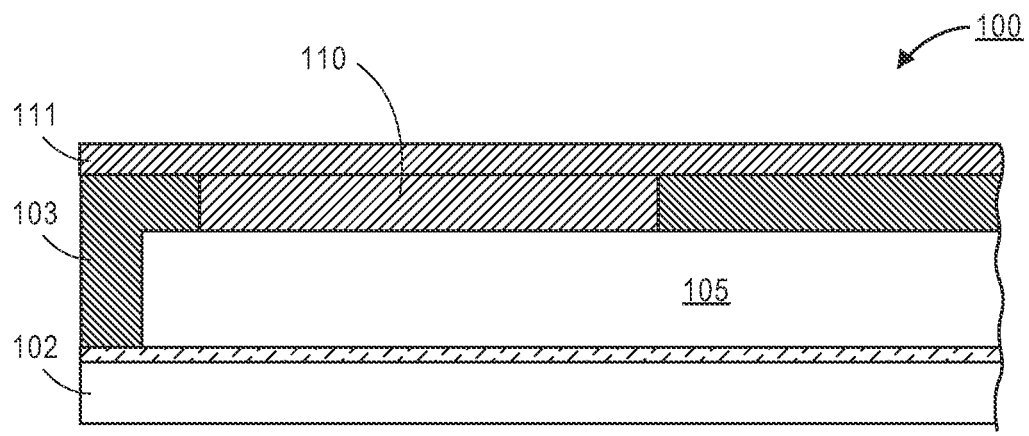
Figure 3:
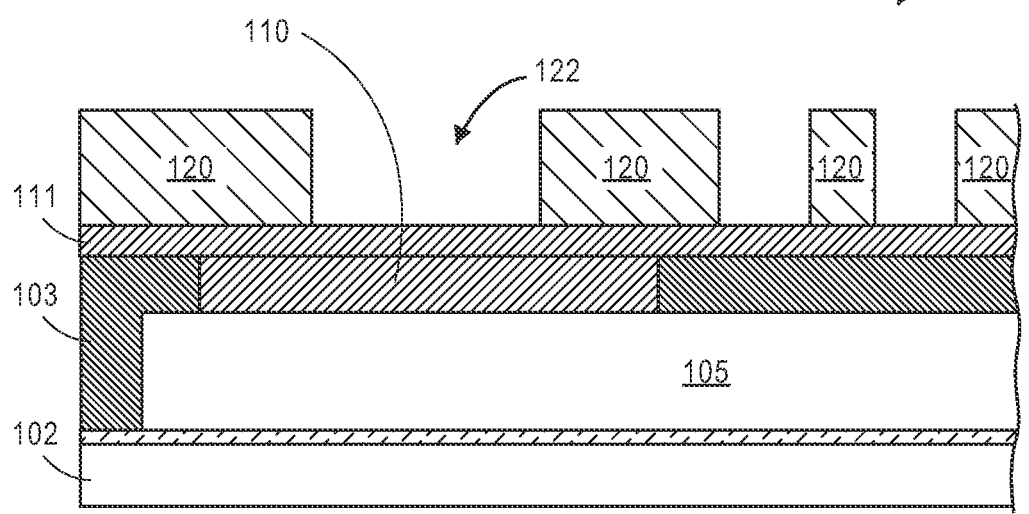
Figure 4:
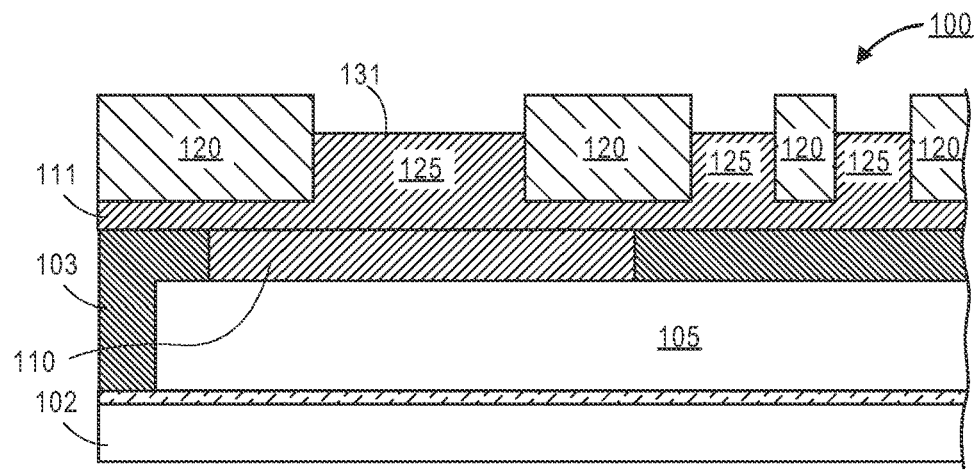

FIG. 2 illustrates seed layer 111 deposited on die pad 110 and molding layer 103. For one embodiment, seed layer 111 is a Titanium, Copper (Ti/Cu) seed layer that is sputtered. For some embodiments, FIGS. 3-6 illustrate forming a fine line spacing (e.g., via 141 of FIG. 6) in foundation layer 100 using the double lithography patterning process. For example, as shown in FIGS. 3-4, the first lithography patterning process defines the traces and the pads that are electroplated. FIG. 3 illustrates first photoresist layer 120 deposited over seed layer 111 and then patterned to form conductive line opening 122 over die pad 105. For one embodiment, the patterning of first photoresist layer 120 may be implemented with lithographic patterning processes (e.g., exposed with a radiation source through a routing layer mask (not shown) and developed with a developer).

FIG. 4 illustrates conductive material 125 deposited into conductive line opening 122 to form conductive line 131. For one embodiment, conductive material 125 is formed using an elytic copper plating. After first photoresist layer 120 has been patterned, conductive line 131 may be formed. For one embodiment, conductive line 131 may be formed with a Cu electroplating process, Sputtered Cu, or the like. Note that unlike a traditional semi-additive process (SAP) flow where a resist layer is then stripped, the embodiments of FIGS. 3-4 illustrate that first photoresist layer 120 is left in place and then second photoresist layer 130 is deposited over first photoresist layer 120, as shown in FIG. 5.

Figure 5:
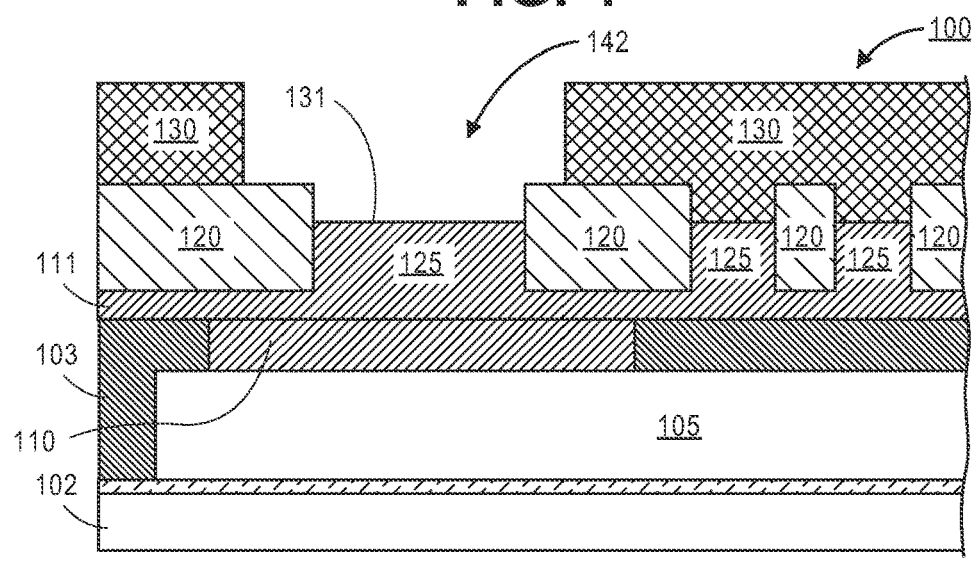
Figure 6:
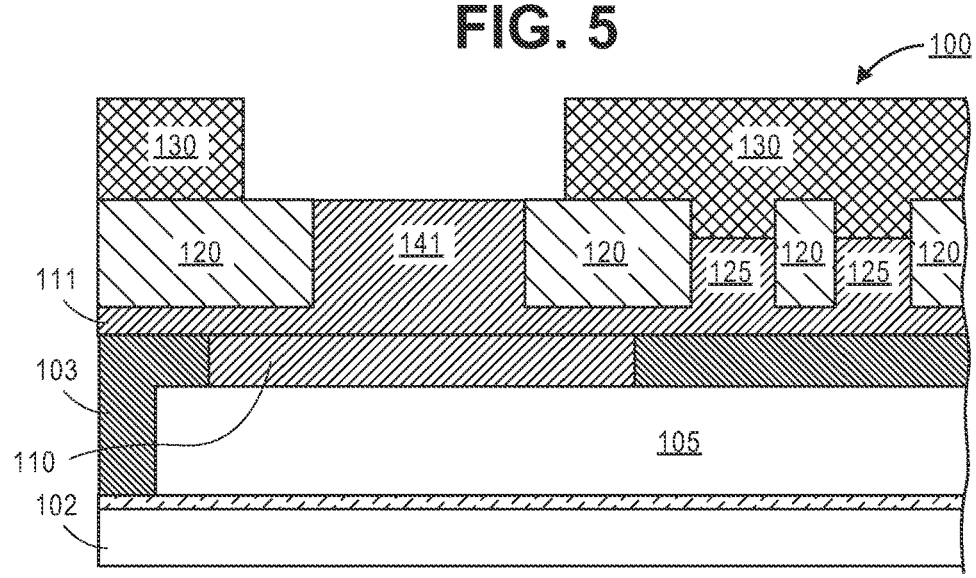

FIG. 5 illustrates second photoresist layer 130 deposited over first photoresist layer 120 and then patterned to form via opening 142 over the conductive line 131. As shown in FIGS. 5-6, the second lithography patterning process further define the vias, where second photoresist layer 130 protects the previously electroplated traces (e.g., conductive material 125) and only exposes the pads where a second electroplating step is needed to fabricate a copper pillar. As used herein, a "copper pillar" refers to a conductive via (e.g., an uFLS) formed using the double lithography patterning process flow as described herein. For one embodiment, the copper pillar is a conductive via, such as via 141 of FIG. 6. As described before, as the via is lithographically defined, its size can be made much smaller than existing advanced laser-drilled vias, and there is no desmear that increases via size as in laser-drilled vias. As the alignment is between litho-to-litho (first photo resist layer to second photo resist layer), the alignment of the via 141 to the underlying pad 125 is much better (compared to laser drilled vias which involve alignment of litho to via). Planarized surface would also provide an added benefit. Smaller via size combined with better alignment between vias/pillars and underlying pads and flat surface due to planarization result in much high routing density.

FIG. 6 illustrates conductive material 125 deposited for a second time into via opening 142 to form via 141. Conductive material 125 is only deposited on the portions of the exposed conductive line, such as via opening 142. For one embodiment, via opening 142 has substantially vertical sidewalls, and likewise conductive line opening 122 also has substantially vertical sidewalls. In addition, FIG. 6 also shows that conductive material 125 is used to form via (pillar) 141 and traces 125. For one embodiment, traces 125 may be used for other routing in that layer. Depending on its application, traces may be used to help distinguish between a via and allow for signal routing within a layer, while vias allow for high density routing between layers.

Figure 7:
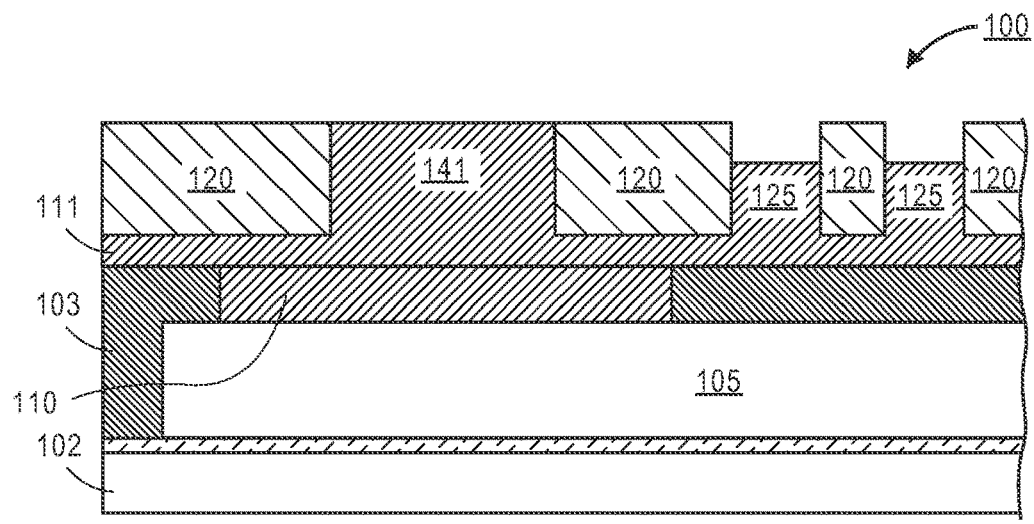
Figure 8:
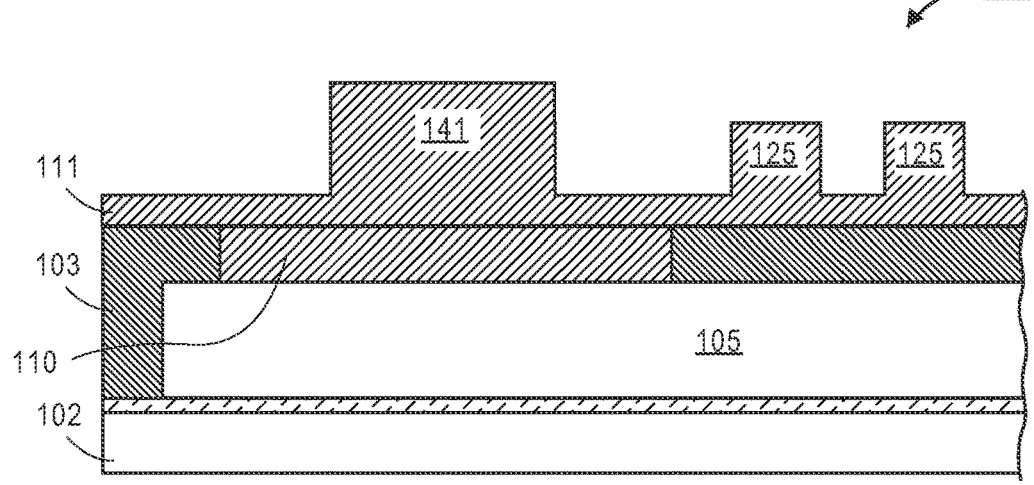
Figure 9:
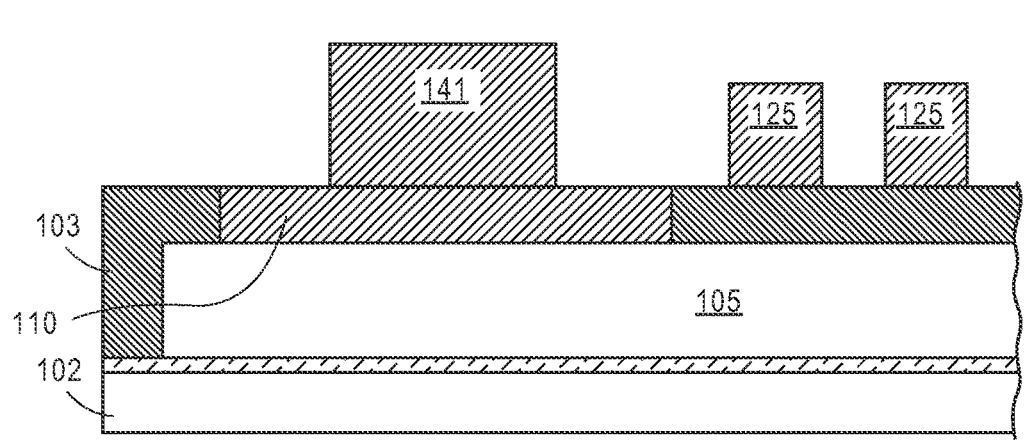
Figure 10:
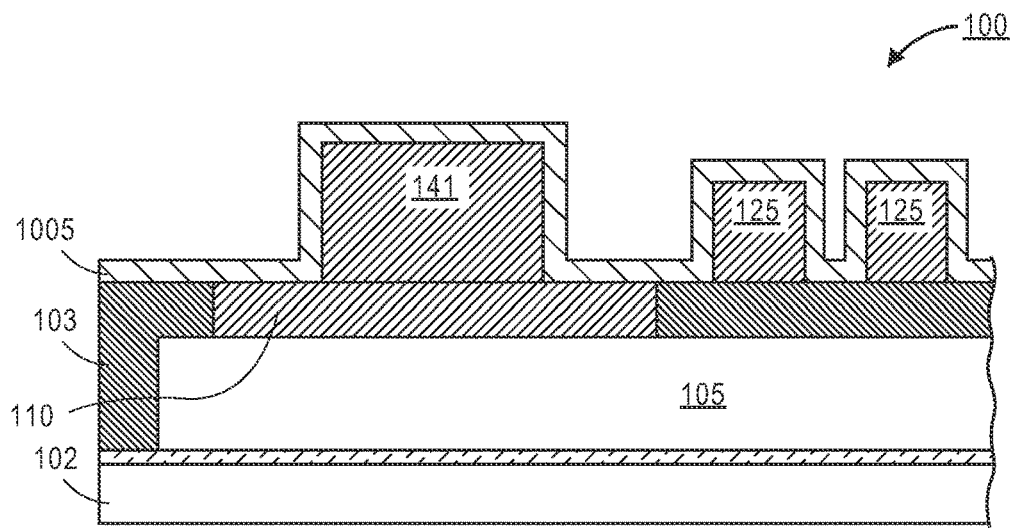
Figure 11:
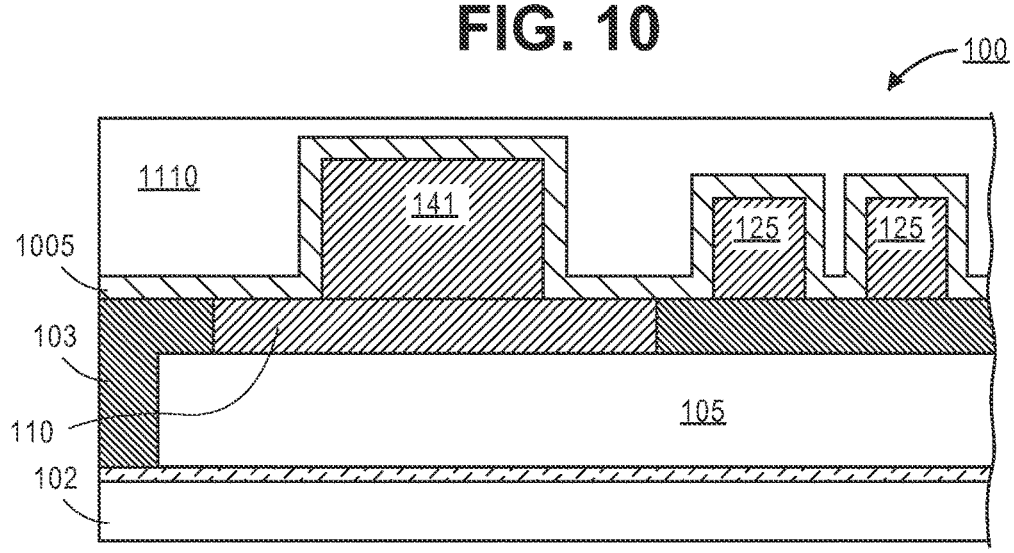
Figure 12:
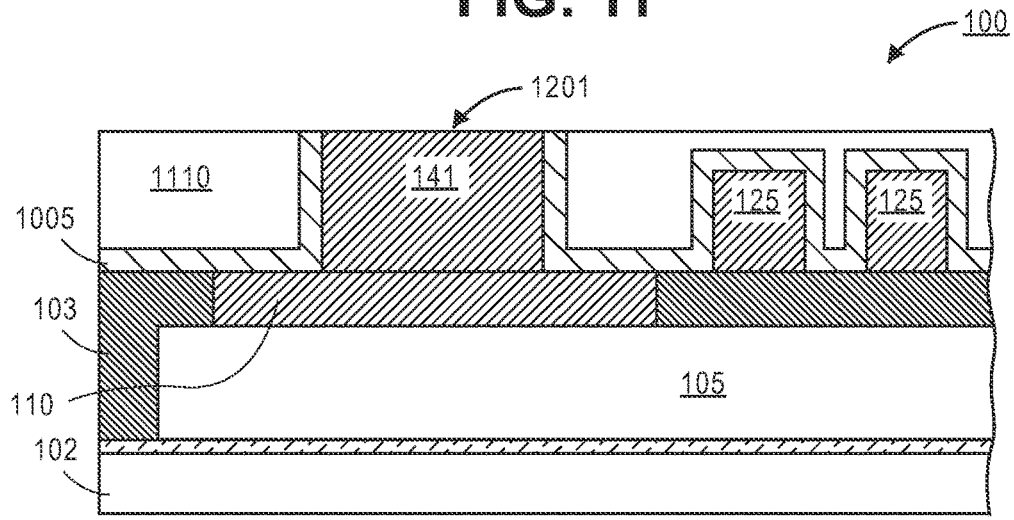

Accordingly, once via 141 is plated, second photoresist layer 130 is removed as shown in FIG. 7, and first photoresist layer 120 is then removed as shown in FIG. 8. Subsequently, FIG. 9 shows portions of the exposed seed layer 111 recessed. For one embodiment, portions of the exposed seed layer 111 may be recessed with a flash etching process, a wet etch or a dry etch process. As shown in FIGS. 10-12, via 141 is formed prior to the formation of adhesion layer 1005 of FIG. 10 and first dielectric layer 1110 of FIG. 11.

Referring now to FIG. 10, to maintain an uFLS dimension for via 141, adhesion layer 1005 is formed over via 141, the one or more remaining traces, die 105, and molding layer 103. Adhesion layer 1005 is a non-etching adhesion promoter (e.g., plasma-enhanced chemical vapor deposition (PECVD) silicon nitride (SiNx)) that is deposited over the copper features (e.g., conductive material 125 and via 141). FIG. 11 illustrates first dielectric layer 1110 formed over adhesion layer 1005 to further cover the copper features.

FIG. 12 illustrates top surface 1201 of via 141 exposed in foundation layer 100. For some embodiments, via 141 is an exposed pillar 141. For other embodiments, one or more exposed pillars (vias) 141, which can be finely spaced (i.e., uFLS), can be interconnected with one or more embedded dies (e.g., dies 105-106 of FIG. 18) to create a VHD routing interconnect layer, as shown in FIG. 18. For some embodiments, one or more exposed pillars (vias) 141 may be used to create a plurality of high density conductive lines (e.g., first and second high density conductive lines 1805-1806 of FIG. 18). The plurality of high density conductive lines may be formed over one or more embedded dies to enable fine die-to-die interconnections and high density routing on a single layer or multiple layers.

For some embodiments, first dielectric layer 1110 and adhesion layer 1005 are recessed to expose top surface 1201 of via 141. Finally, after the desired number of high density routing layers are formed in foundation layer 100, one or more pillars are revealed. For another embodiment, a traditional SAP process may then be used to form one or more coarse conductive lines (e.g., conductive lines 1807 of FIG. 19) on a second dielectric layer (not shown) for the desired number of routing layers needed to fan out bumping on substrate pitches.

For one embodiment, via 141 is coupled to die pad 110 by the exposed top portion 104 (shown in FIG. 1) of die pad 110 that was formed in molding layer 103. For some embodiments, a plurality of via openings may be formed in foundation layer 100. The plurality of via openings may be formed in the second photoresist layer with a single patterning process. Note that the plurality of via openings may be formed with a plurality of shapes or a plurality of sizes.

Note that unlike a standard SAP where vertical connections are made by drilling, FIG. 12 requires a pillar reveal step to expose the metal pillar (i.e., via 141). For one embodiment, a plasma etching, wet etching or a mechanical grinding/polishing may be used to expose top surface 1201 of via 141. In one embodiment, the process is chosen to provide as flat a surface as possible which would provide a good depth of focus for subsequent lithography process which will enhance the resolution enabling uFLS. After this, the double patterning process (i.e., the litho-plate, litho-plate steps) may be repeated to create as many high density routing layers as needed.

For one embodiment, the high density routing in foundation layer 100 is obtained by replacing the laser drilling for via formation with a lithographic patterning process to form the via on the die pad (or embedded die pad) prior to depositing a dielectric layer. After the via is formed, a dielectric layer may then be formed over the die pad, the embedded die, and the via. The dielectric layer may be recessed to reveal a top surface of the via so that the next layer may be formed. Using a process such as this allows for high density routing layers that can be used to fan out die(s) with bump pitches too dense for current FO-PLP technologies. Accordingly, double lithography patterning method described herein allows us to fabricate pillars with high routing density, as shown in FIGS. 21-23.

Figure 13:
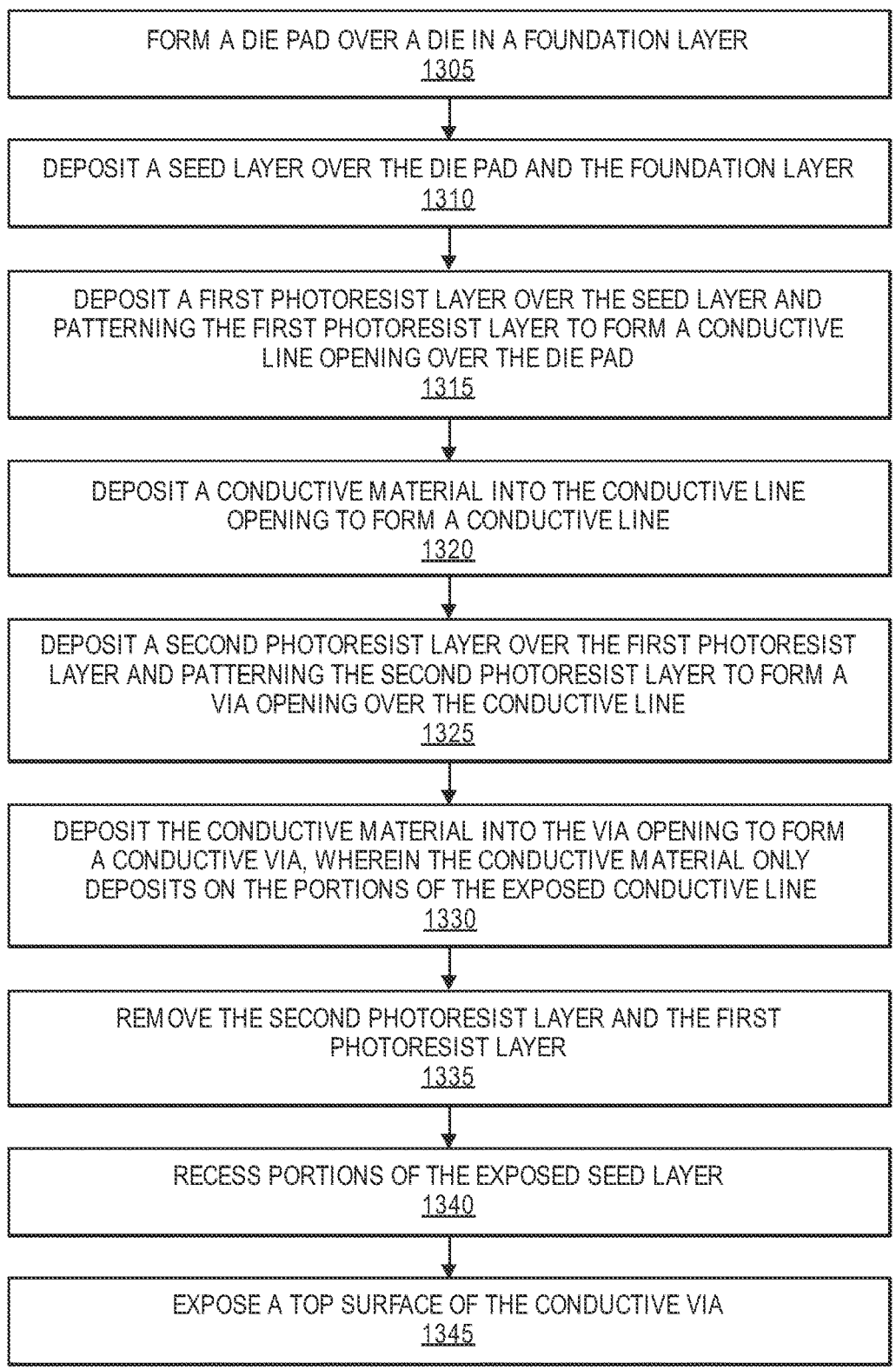
FIG. 13 is a process flow illustration of a method of forming a conductive via in a foundation layer, according to one embodiment.

FIG. 13 shows process flow 1300 to illustrate a method of forming a conductive via in a foundation layer. Process flow 1300 shows a method of forming a conductive via as shown in FIGS. 1-12. For one embodiment, process flow 1300 may implement a lithographic patterning process as described herein. Process flow 1300 enables fine die-to-die interconnections and high density routing in a foundation layer (e.g., foundation layer 100 of FIGS. 1-12). Process flow 1300 may also form uFLS routing layers for embedded die-to-die interconnections using a FO-PLP process.

At block 1305, processing flow forms a die pad over a die in a foundation layer as shown in FIG. 1. For one embodiment, the foundation layer is at least one of a substrate and a printed circuit board. At block 1310, processing flow deposits a seed layer over the die pad and the foundation layer as shown in FIG. 2. At block 1315, processing flow deposits a first photoresist layer over the seed layer and patterns the first photoresist layer to form a conductive line opening over the die pad, as shown in FIG. 3.

At block 1320, processing flow deposits a conductive material into the conductive line opening to form a conductive line as shown in FIG. 4. At block 13025, processing flow deposits a second photoresist layer over the first photoresist layer and patterns the second photoresist layer to form a via opening over the conductive line, as shown in FIG. 5. At block 1330, processing flow deposits the conductive material into the via opening to form a via as shown in FIG. 6. For one embodiment, the conductive material only deposits on the portions of the exposed conductive line. For another embodiment, the via opening and the conductive line opening have substantially vertical sidewalls.

At block 1335, processing flow removes the second photoresist layer and the first photoresist layer as shown in FIGS. 7-8. At block 1340, processing flow recesses portions of the exposed seed layer as shown in FIG. 9. At block 1345, processing flow exposes a top surface of the via as shown in FIG. 12.

For some embodiments, prior to forming the die pad over the die in the foundation layer, process flow forms the die (or multiple dies) over an adhesive layer in the foundation layer. Processing flow then depositing a molding layer over the die pad, the die, and the adhesive layer. Subsequently, process flow then recesses the molding layer to expose a top portion of the die pad, using the top portion of the die pad to form the conductive via (i.e., the pillar formation).

For another embodiment, prior to exposing the top surface of the via, the process flow forms an adhesion layer over the via, the die, and the foundation layer, as shown in FIG. 10. The process flow further forms a first dielectric layer over the adhesion layer as shown in FIG. 11. Lastly, the process flow then recesses the first dielectric layer and the adhesion layer to expose the top surface of the via as shown in FIG. 12.

FIGS. 14-20 are cross-sectional views of a method of forming a foundation layer that includes an adhesive layer, one or more dies, a molding layer, a plurality of high density conductive lines, pillars, and one or more dielectric layers. FIGS. 14-20 show a method of forming foundation layer 1400 using a lithographic pattering process with a double lithography patterning process flow for fine line spacing, as described herein. FIGS. 14-20 also show a method of forming one or more VHD interconnect layers (or one or more VHD dielectric layers) in the foundation layer (e.g., as shown by high density dielectric layers 1801a-c of FIG. 18). In one embodiment, a VHD interconnect layer includes at least one of a plurality of VHD vias (e.g., as shown by first high density conductive vias 141 of FIG. 18), a plurality of VHD conductive lines (e.g., as shown by first high density conductive lines 1805 of FIG. 18), and a VHD dielectric layer (e.g., as shown by first high density dielectric layer 1801b of FIG. 18).

Figure 14:
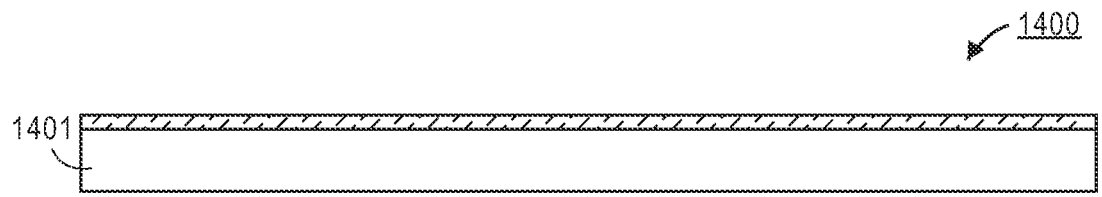
FIGS. 14-20 are cross-sectional views of a method of forming a foundation layer that includes an adhesive layer, one or more dies, a molding layer, a plurality of high density conductive lines, vias, and one or more dielectric layers, according to one embodiment.

FIG. 14 illustrates foundation layer 1400 that includes adhesive layer 1401. For one embodiment, adhesive layer 1401 is a double-sided release tape. Adhesive layer 1401 is similar to adhesive layer 102 of FIGS. 1-12.

Figure 15:
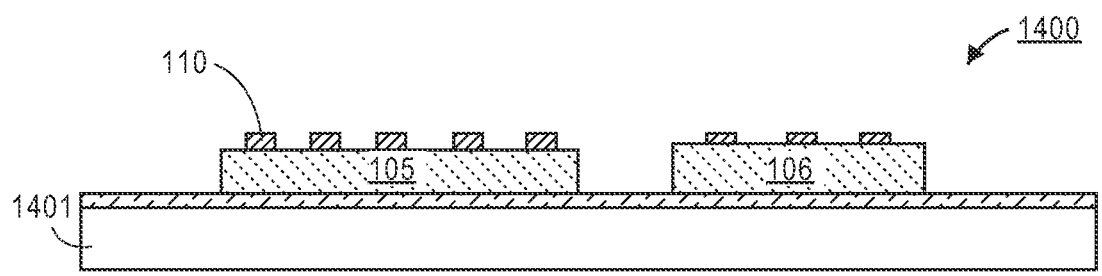
Figure 16:
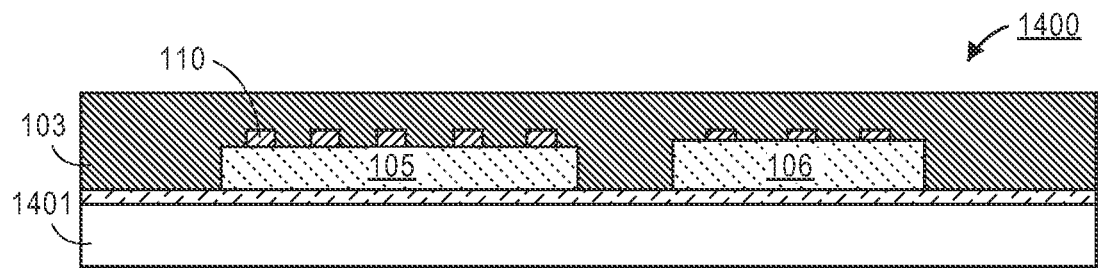
Figure 17:
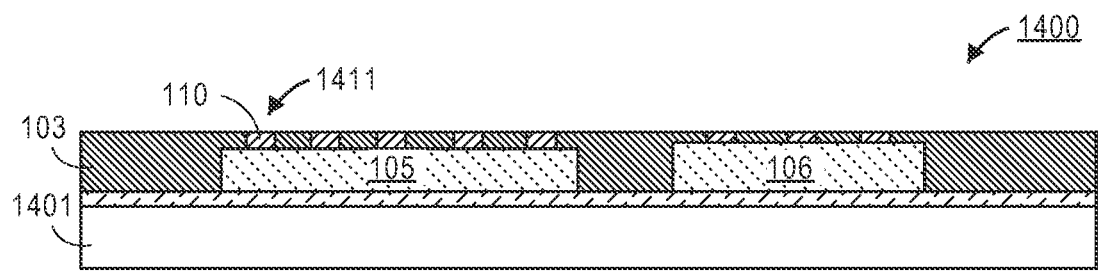

FIG. 15 illustrates dies 105-106 formed over adhesive layer 1401. Dies 105-106 may include, but not limited to, a semiconductor die, an integrated circuit, an embedded die, a CPU, and a microprocessor. For one embodiment, dies 105-106 need to be interconnected with a high density routing (e.g., uFLS). For some embodiments, dies 105-106 are placed on adhesive layer 1401 using a die mount or a pick and place tool. FIG. 16 illustrates molding layer 103 formed over die pad 110, dies 105-106, and adhesive layer 1401. For one embodiment, compression molding is used to embed dies 105-106 in molding layer 103. FIG. 17 illustrates molding layer 103 of foundation layer 1400 is recessed to expose top portion 1411 of die pad 110. For one embodiment, molding layer 103 is recessed by grinding and/or polishing molding layer 104 until top portion 1411 of die pad 110 is exposed/revealed.

For one embodiment, after exposing die pad 1411 shown in FIG. 17, foundation layer 1800 shown in FIG. 18 illustrates VHD pillars 141-143 (also referred to as high density conductive vias, VHD vias, etc.), first and second VHD conductive lines 1805-1806 (or first and second high density conductive lines), die pads 110, dies 105-106, and molding layer 103. VHD pillars 141-143 are formed using the double lithography patterning process and similar to the formed via 141 of FIG. 12. Foundation layer 1800 of FIGS. 18-20 is similar to foundation layer 1400 of FIGS. 14-17, but foundation layer 1800 has first and second VHD conductive lines 1805-1806 and VHD pillars 141-142 that form VHD dielectric layers 1801a-c (also referred to as high density dielectric layers, VHD interconnect layers, etc.). For one embodiment, each of the VHD dielectric layers 1801a-c provide a VHD interconnect layer that enables fine die-to-die interconnections and high density routing. Described below in FIGS. 18-20 is a way of forming a plurality of high density conductive vias (e.g., conductive vias 141-143), a plurality of high density conductive lines (e.g., lines 1805-1806), and a plurality of high density dielectric layers (e.g., layers 1801a-c) using the double lithographic patterning process shown in FIGS. 1-12. Each of the plurality of high density conductive lines (e.g., lines 1805-1806) are respectively formed over the plurality of first and second high density conductive vias (e.g., VHD pillars 141-142 of FIGS. 18-20), where the high density conductive vias are finely spaced (uFLS).

For some embodiments, according to FIG. 18-20, VHD pillars 141-143 can be finely spaced and interconnected with embedded dies 105-106 and VHD conductive lines 1805-1806 to create VHD dielectric layers 1801a-c.

Referring now to FIG. 18, foundation layer 1800 has adhesive layer 1401, dies 105-106, molding layer 103, VHD pillars 141-143, VHD conductive lines 1805-1806, VHD dielectric layers 1801a-c, and conductive line 1807. For one embodiment, dies 105-106, which include a plurality of die pads (not shown), are placed over adhesive layer 1401. For one embodiment, molding layer 103 is formed over the plurality of die pads, dies 105-106, and adhesive layer 1401. Molding layer 103 is recessed to expose top portions (e.g., exposed die pad 1411 of FIG. 17) of the plurality of die pads.

For one embodiment, first VHD conductive vias 141 are formed over the plurality of die pads of dies 105-106. For one embodiment, first VHD conductive lines 1805 are formed over first VHD conductive vias 141, dies 105-106, and molding layer 103. Further, for some embodiments, each of the first VHD conductive lines 1805 is coupled to at least one of the first VHD conductive vias 141.

For certain embodiment, VHD conductive lines 1805-1806 are one or more VHD traces/pads that are formed using the double lithographic pattering process and used to enable fine die-to-die interconnects. For one embodiment, first VHD dielectric layer 1801a is formed over first VHD conductive vias 141, dies 105-106, and molding layer 103, where first VHD conductive lines 1805 are formed on (or above) first VHD dielectric layer 1801a. For some embodiments, VHD dielectric layers 1801a-c may be a polymer material, such as, for example, polyimide, epoxy or build-up film (BF). For one embodiment, first VHD dielectric layer 1801a may be one layer in a stack that includes multiple VHD dielectric layers (e.g., layers 1801b-c) used to form a build-up structure. As such, first VHD dielectric layer 1801a may be formed over second VHD dielectric layer 1801b, and third VHD dielectric layer 1801c formed over second VHD dielectric layer 1801b, as shown in FIG. 18. For some embodiments, VHD conductive lines 1805-1806 and VHD pillars 141-143 may include a minimum line width L and a spacing S that are approximately 2 μm or less, which enables one or more VHD interconnect layers.

For certain embodiments, VHD pillars 141-143 (or VHD conductive vias) are formed using the following double lithographic patterning process, which is similar to the double lithographic patterning process described in FIGS. 1-12. To form a VHD pillar, for example, a seed layer is deposited over one or more die pads, dies, and mounding layer. Further, a first photoresist layer is deposited over the seed layer and the first photoresist layer is then patterned to form one or more conductive line openings over the one or more die pads. A conductive material is then deposited into the one or more conductive line openings to form one or more conductive lines. Subsequently, a second photoresist layer is deposited over the first photoresist layer and the second photoresist layer is then patterned to form one or more via openings over the one or more conductive lines. The conductive material is then deposited into the one or more via openings to form the VHD pillar, where the conductive material only deposits on the portions of the exposed conductive lines. Accordingly, the second photoresist layer, the first photoresist layer, and then portions of the exposed seed layer are removed respectively. Lastly, one or more top surfaces of the VHD pillars are exposed on the first VHD dielectric layer (e.g., layer 1801*a*).

Continuing with FIG. 18, first VHD conductive lines 1805 are coupled to first VHD conductive pillars 141 by the one or more top surfaces exposed on first VHD dielectric layer 1801*a*. Also note, that each die pad (e.g. die pad 110 of FIG. 17) of dies 1105-106 is coupled to at least one of the first VHD conductive lines 1805. For another embodiment, second VHD conductive pillars 142 are formed over first VHD conductive lines 1805. Further, second VHD conductive lines 1806 are formed over second VHD pillars 142, where each of the second VHD conductive lines 1806 is coupled to at least one of the second VHD pillars 142. For one embodiment, second VHD dielectric layer 1801*b* is formed over first VHD conductive lines 1805 and second VHD pillars 142, where second VHD conductive lines 1806 are formed on/above second VHD dielectric layer 1801*b*. Second VHD conductive lines 1806 are coupled to second VHD pillars 142 by one or more top surfaces exposed on second VHD dielectric layer 1801*b*.

For another embodiment, third VHD pillars 143 are formed over second VHD conductive lines 1806. Subsequently, third conductive lines 1807 are formed over third VHD pillars 143, where each of the third conductive lines is coupled to at least one of the third VHD pillars 143. Note that third conductive lines 1807 are formed above the one or more VHD interconnect layers and are used to form the one or more coarse dielectric layers (e.g., layers 1901*a-b*). For one embodiment, third VHD dielectric layer 1801*c* is formed over second VHD conductive lines 1806 and third VHD pillars 143, where third conductive lines 1807 are formed on third VHD dielectric layer 1801*c*. Third conductive lines 1807 are coupled to third VHD pillars 143 by one or more top surfaces exposed on third VHD dielectric layer 1801*c*. As shown in FIG. 19, the vias/pillars and conductive lines 1807-1808 may have a line width L that is 9 μm or smaller, and a spacing S that is 12 μm or smaller—which form the one or more dielectric layers 1901*a-b* (using a traditional SAP process).

FIG. 19 illustrates third conductive lines 1807 and fourth conductive lines 1808 formed over one or more vias forming dielectric layers 1901*a-b*. As shown in FIG. 19, for some embodiments, foundation layer 1800 has one or more dielectric layers 1901*a-b* (or coarse dielectric layers formed using a traditional SAP process). Dielectric layer 1901*a* is formed over third conductive lines 1807 and third VHD dielectric layer 1801*c*. Dielectric layer 1901*b* is formed over fourth conductive lines 1808 and dielectric layer 1901*a*. For one embodiment, dielectric layers 1901*a-b* may be formed with any suitable process, such as lamination or slit coating and curing. For another embodiment, dielectric layers 1901*a-b* is formed to a thickness that will completely cover a top surface of the one or more vias to account for uneven surfaces and to ensure that the desired minimum thickness is reached across the entire foundation layer 1800. For some embodiments, the thickness of dielectric layers 1901*a-b* is minimized in order to reduce the etching time required to expose the one or more vias in a subsequent processing operation.

FIG. 19 also shows that foundation layer 1800 includes one or more connection pads 1920 formed over fourth conductive lines 1808 and dielectric layer 1901*b*. The one or more connection pads 1920 extend through dielectric layer 1901*b*. Foundation layer 1800 has one or more solder stops 1910 formed over dielectric layer 1901*b*. The one or more solder stops 1910 are formed between the one or more connection pads 1910. For one embodiment, a plurality of solder balls (or C4 pads) (not shown) may be mounted on the one or more connection pads 1910. For another embodiment, the one or more connection pads 1920 are coupled to conductive lines 1807-1808. Lastly, in FIG. 20, adhesive layer 1401 is removed from underneath molding layer 103 and dies 105-106 using a simple heat treatment.

Using the lithographic patterning process of foundation layer 1800 helps to implement/fabricate VHD pillars 141-143 and VHD conductive lines 1805-1806 that are used to form one or more VHD interconnect layers 1801*a-c* with essentially a very low misalignment, because VHD pillars 141-143 are formed with the double lithograph patterning process flow as shown in FIGS. 21-23.

FIGS. 21-23 illustrate a method for forming a conductive via using the double lithography patterning process flow, in a foundation layer, according to some embodiments.

Figure 21A:
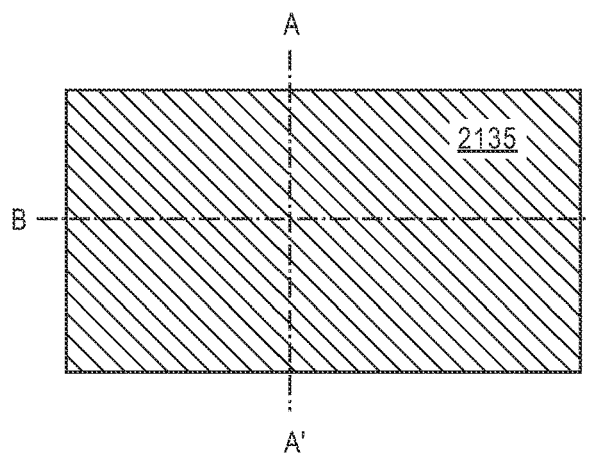
FIG. 21A is a plan view of a foundation layer with a seed layer formed over the surface, according to one embodiment.
Figure 21B:
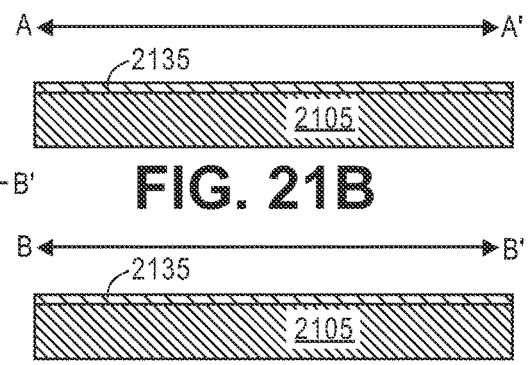
FIG. 21B-C are two corresponding cross-sectional illustrations of a foundation layer with a seed layer formed over the surface, according to one embodiment.
Figure 21C:
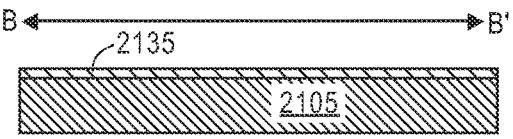

FIG. 21A shows a plan view of a foundation layer with a seed layer formed over the surface. FIGS. 21B-C show two corresponding cross-sectional illustrations of the foundation layer with the seed layer formed over the surface.

Referring now to FIGS. 21B-C, for one embodiment, seed layer 2135 is deposited over a top surface of molding layer 2105. Molding layer 2105 is similar to molding layer 103 of FIGS. 1-12 and 14-20. Molding layer 2105 may have one or more embedded dies (e.g., dies 105-106 of FIG. 14-20). For one embodiment, molding layer 103 is made of epoxy with filler material. For one embodiment, seed layer 2135 may be a Titanium/Copper (Ti/Cu) seed layer that is sputtered.

Figure 22A:
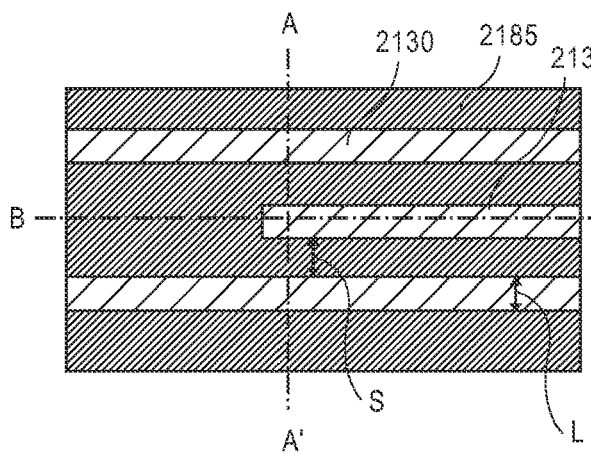
FIG. 22A is a plan view of the foundation layer after high density conductive lines have been formed over the surface, according to one embodiment.
Figure 22B:
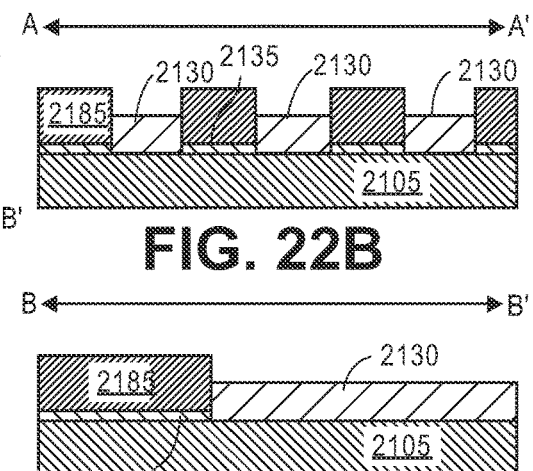
FIG. 22B-C are two corresponding cross-sectional illustrations of the foundation layer after high density conductive lines have been formed over the surface, according to one embodiment.
Figure 22C:
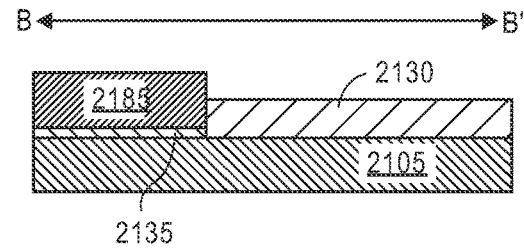

FIG. 22A shows a plan view of the foundation layer after high density conductive lines have been formed over the surface. FIGS. 22B-C show two corresponding cross-sectional illustrations of the foundation layer after high density conductive lines have been formed over the surface.

Referring now to FIGS. 22B-C, first photoresist layer 2185 is formed over seed layer 2135 and patterned to provide openings for the formation of high density conductive lines 2130. According to one embodiment, the patterning of first photoresist layer 2185 may be implemented with lithographic patterning processes (e.g., exposed with a radiation source through a routing layer mask (not shown) and developed with a developer). After first photoresist layer 2185 has been patterned, high density conductive lines 2130 may be formed. For one embodiment, high density conductive lines 2130 may be formed with an elytic copper (Cu) plating, Sputtering Cu, or the like.

Figure 23A:
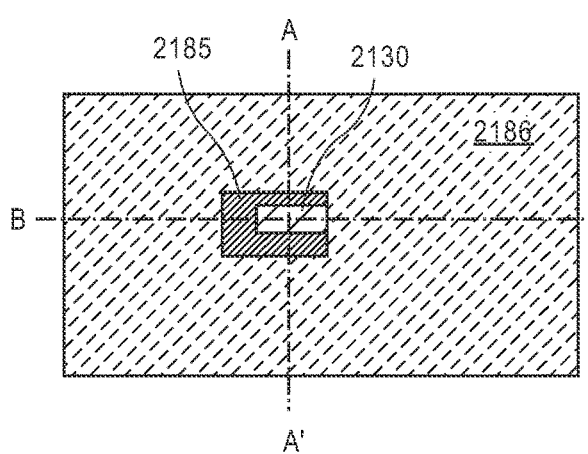
FIG. 23A is a plan view of the foundation layer after a second photoresist material is deposited and patterned to form via openings, according to one embodiment.
Figure 23B:
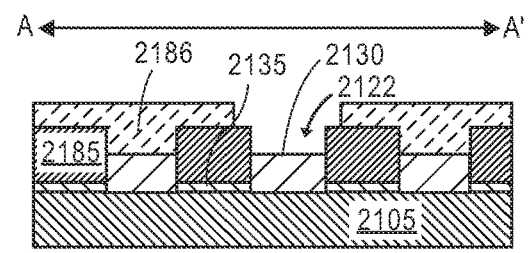
FIG. 23B-C are two corresponding cross-sectional illustrations of the foundation layer after a second photoresist material is deposited and patterned to form via openings, according to one embodiment.
Figure 23C:
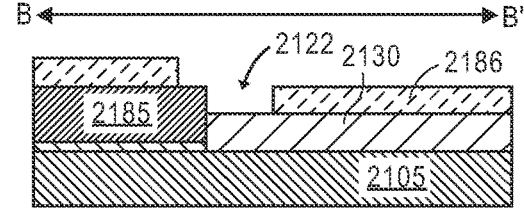

FIG. 23A shows a plan view of the foundation layer after a second photoresist material is deposited and patterned to form via openings. FIGS. 23B-C show two corresponding cross-sectional illustrations of the foundation layer after a second photoresist material is deposited and patterned to form via openings, according to one embodiment.

Referring now to FIGS. 23B-C, second photoresist material 2186 applied and then patterned with a via layer mask (not shown) to form via openings 2122. The width of the opening needs to account for any misalignment during the patterning of second photoresist layer 2186. Accordingly, for some embodiments, the width of via opening 2122 may be at least the minimum line width L plus twice the misalignment for the lithographic patterning process. For one embodiment, the width of via opening 2122 may reveal a surface of first photoresist layer 2185 in addition to a portion of the high density conductive line 2130.

As shown in FIGS. 23B-C, second photoresist material 2186 is deposited over the top surface of first photoresist material 2185, though embodiments are not limited to such configurations. For certain embodiments, a conductive via (e.g., via 141 of FIG. 12) (not shown) may be formed in via opening 2122. According to one embodiment, the conductive via (i.e., the pillar) may be formed with an elytic Cu plating, Sputtering Cu, or the like. Note that the via opening 2122 is formed by a litho to litho alignment (aligning the second photo resist layer to the first photo resist layer) compared to the laser via to litho alignment in traditional SAP approach and hence has significantly improved alignment resulting in high routing density.

For certain embodiments, first and second photoresist layers 2185-2186 and seed layer 2135 may then be removed. For example, first and second photoresist layers 2185-2186 may be stripped, and seed layer 2135 may then be removed with a flash etching process.

For certain embodiments, an adhesion layer (as shown by adhesion layer 1005 of FIG. 10) is formed over via 2122, high density conductive lines (or traces/pads) 2130, a die (as shown by die 105 of FIG. 10), and molding layer 2105. Dielectric layer (as shown by dielectric layer 1110 of FIG. 11) is deposited on the adhesion layer. Lastly, for one embodiment, the dielectric and adhesion layer are then recessed to expose a top portion of the conductive via, as shown in FIG. 12.

Embodiments of FIGS. 21-23 use lithographic patterning operations to allow the minimum feature size and misalignment to be reduced. As such, the minimum line width L and the minimum spacing S of the patterned features may be smaller than would otherwise be possible when laser drilling is used to form the conductive vias. As such, the double lithography patterning process flow, described herein, may include a minimum line width L and spacing S that are limited only by the lithography equipment utilized.

Figure 24:
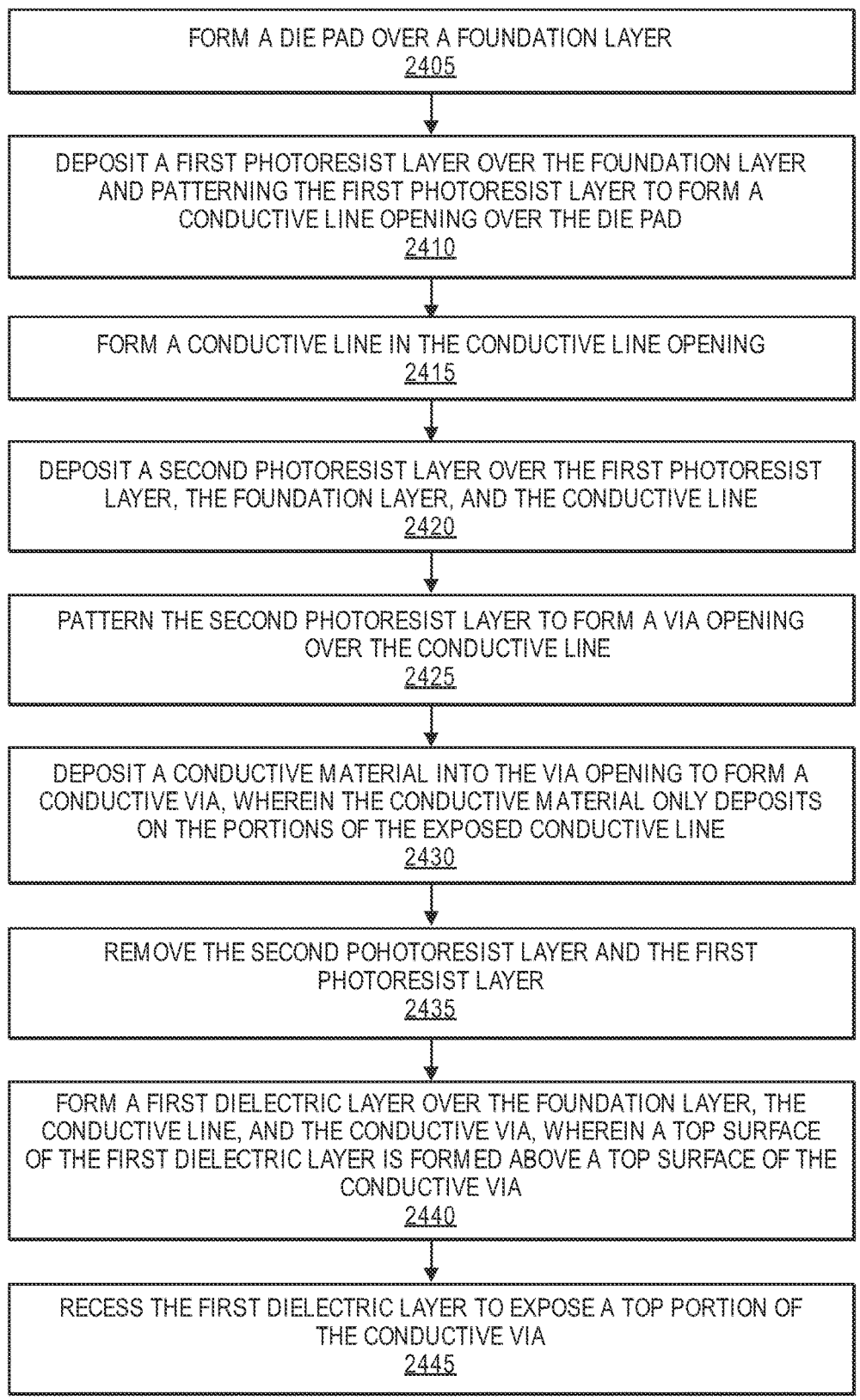
FIG. 24 is a process flow illustrating a method of forming a conductive via in a foundation layer, according to one embodiment.

FIG. 24 is a process flow 2400 illustrating a method of forming a conductive via in a foundation layer, according to one embodiment. Process flow 2400 shows a method of forming a conductive via as shown, for example, in FIGS. 14-20 and FIGS. 21-23. For one embodiment, process flow 2400 may implement a lithographic patterning process as described herein. Process flow 2400 enables fine die-to-die interconnections and high density routing in a foundation layer. Process flow 2400 may also form uFLS routing layers for embedded die-to-die interconnections using a FO-PLP approach.

At block 2405, the process flow forms a die pad over a foundation layer (e.g., as shown in FIG. 15). Note that, according to some embodiments, the formed die pad is similar to an exposed die pad as shown in FIG. 17 (i.e., an expose top portion of a die pad). For one embodiment, the foundation layer is at least one of a substrate and a printed circuit board. For one embodiment, to form the die pad over the foundation layer, the process flow forms a die over an adhesive layer in the foundation layer as shown in FIG. 15. The process flow then deposits a molding layer over the die and the adhesive layer (as shown in FIG. 16), where the die includes a die pad. The process flow then recesses the molding layer to expose a top portion of the die pad, as shown in FIG. 17. For another embodiment, the conductive via is coupled to the die pad by the exposed die pad formed in the molding layer.

At block 2410, the process flow deposits a first photoresist layer over the foundation layer and patterns the first photoresist layer to form a conductive line opening over the die pad (e.g., as shown in FIG. 22). At block 2415, the process flow forms a conductive line in the conductive line opening as shown in FIG. 22. At block 2420, the process flow deposits a second photoresist layer over the first photoresist layer, the foundation layer, and the conductive line (as shown in FIG. 23). At block 2425, the process flow patterns the second photoresist layer to form a via opening over the conductive line as shown in FIG. 23.

At block 2430, the process flow deposits a conductive material into the via opening to form a conductive via (e.g., via/pillar 141 of FIGS. 12 and 18). For one embodiment, the conductive material only deposits on the portions of the exposed conductive line. At block 2435, the process flow removes the second photoresist layer and then the first photoresist layer. For one embodiment, when removing the first photoresist layer and the second photoresist layer, the process flow removes the second photoresist layer prior to removing the first photoresist layer, as shown in FIG. 7.

At block 2440, the process flow forms a first adhesion layer over the foundation layer, the conductive line, and the conductive via (as shown in FIG. 10). For one embodiment, the adhesion layer is formed before a dielectric layer. The dielectric layer is then formed over/on the adhesion layer. At block 2445, the process flow recesses the first dielectric layer and adhesion layer to expose a top portion of the conductive via (e.g., as shown in FIG. 12).

For alternative embodiments, the first photoresist can be stripped post pad/trace formation and the second resist layer can be formed on the pad/trace with openings in the pad region to form the conductive vias (or pillars). Note that the alignment is better even in this case as the second photoresist is aligned to the litho-defined pad instead of a litho-to-laser drilled via in the traditional SAP approach. For some embodiments, small conductive vias as described herein combined with planarization lead to higher routing density to enable improved fine die-to-die interconnections.

Figure 25:
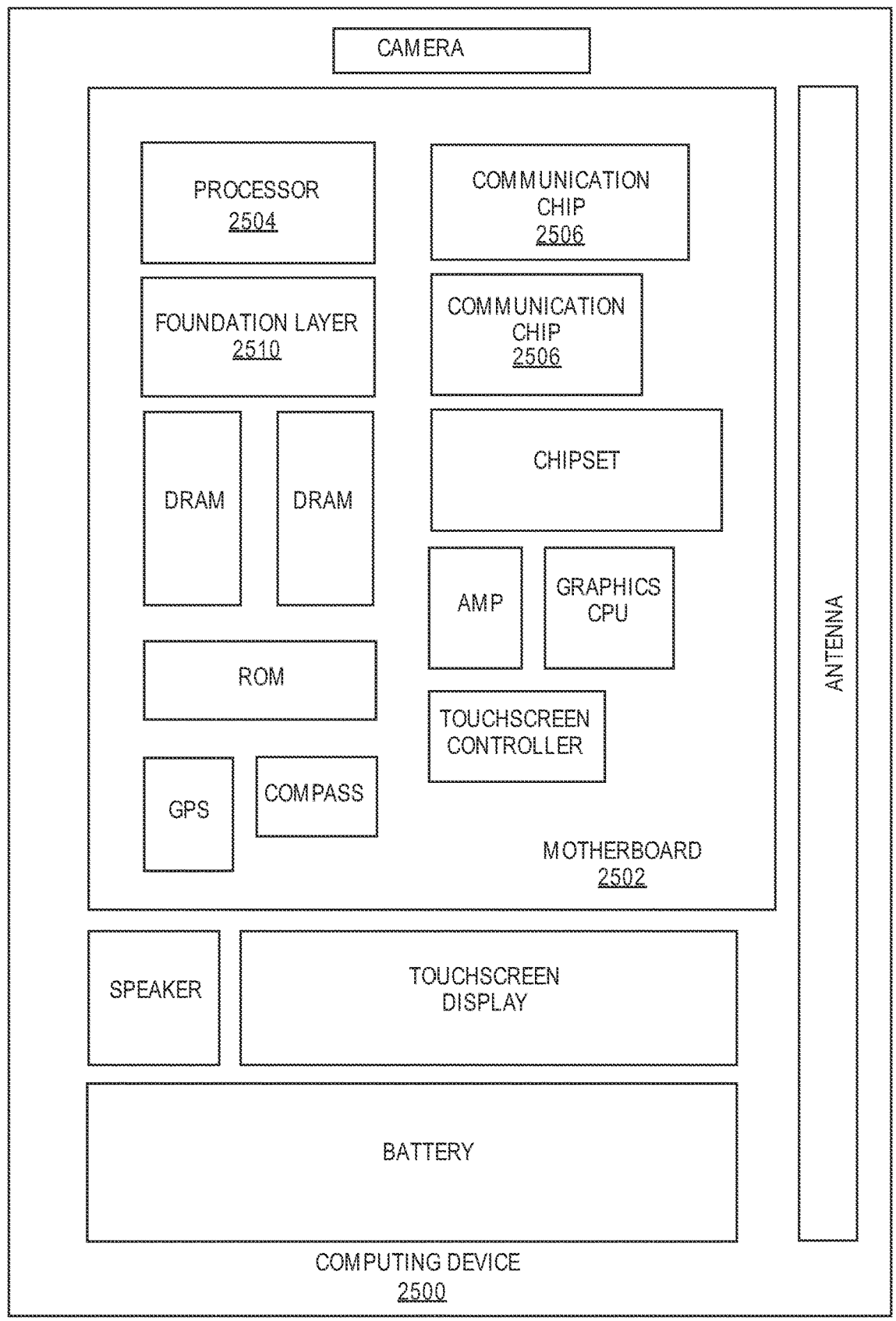
FIG. 25 is a schematic block diagram illustrating a computer system that utilizes a foundation layer, according to one embodiment.

FIG. 25 is a schematic block diagram illustrating a computer system that utilizes a foundation layer, according to one embodiment. FIG. 25 illustrates an example of computing device 2500. Computing device 2500 houses motherboard 2502. Motherboard 2502 may include a number of components, including but not limited to processor 2504, foundation layer 2510, and at least one communication chip 2506. Processor 2504 is physically and electrically coupled to motherboard 2502. For some embodiments, at least one communication chip 2506 is also physically and electrically coupled to motherboard 2502. For other embodiments, at least one communication chip 2506 is part of processor 2504.

Depending on its applications, computing device 2500 may include other components that may or may not be physically and electrically coupled to motherboard 2502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 2506 enables wireless communications for the transfer of data to and from computing device 2500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 2506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 2500 may include a plurality of communication chips 2506. For instance, a first communication chip 2506 may be dedicated to shorter range wireless communications such as Wi-Fi and Bluetooth and a second communication chip 2506 may be dedicated to longer range wireless communications such as GPS, EDGE, GPRS, CDMA, WiMAX, LTE, Ev-DO, and others.

Processor 2504 of computing device 2500 includes an integrated circuit die packaged within processor 2504. Foundation layer 2510 may be a packaging substrate and/or a printed circuit board. Foundation layer 2510 may be implemented to provide uFLS routing layers for one or more die-to-die interconnections. Foundation layer 2510 may use lithographically defined vias to enable uFLS for VHD routing between, for example, embedded dies that use a FO-PLP process. For certain embodiments, the integrated circuit die may be packaged with one or more devices on foundation layer 2510 that includes a thermally stable RFIC and antenna for use with wireless communications. The term "processor" may refer to any device or portion of a device that processes electronic data from registers and/or memory to transform that electronic data into other electronic data that may be stored in registers and/or memory.

At least one communication chip 2506 also includes an integrated circuit die packaged within the communication chip 2506. For some embodiments, the integrated circuit die of the communication chip may be packaged with one or more devices on foundation layer 2510, as described herein, to provide uFLS with VHD interconnect layers.

The following examples pertain to further embodiments. The various features of the different embodiments may be variously combined with some features included and others excluded to suit a variety of different applications.

The following examples pertain to further embodiments:

For one embodiment, a method of forming a conductive via, the method comprising: forming a die pad over a die in a foundation layer; depositing a seed layer over the die pad and the foundation layer; depositing a first photoresist layer over the seed layer and patterning the first photoresist layer to form a conductive line opening over the die pad; depositing a conductive material into the conductive line opening to form a conductive line; depositing a second photoresist layer over the first photoresist layer and patterning the second photoresist layer to form a via opening over the conductive line; depositing the conductive material into the via opening to form the conductive via, wherein the conductive material only deposits on the portions of the exposed conductive line; removing the second photoresist layer and the first photoresist layer; recessing portions of the exposed seed layer; and exposing a top surface of the conductive via.

For another embodiment, the method further comprising forming an adhesion layer over the conductive via, the die, and the foundation layer prior to exposing the top surface of the conductive via.

For one embodiment, the method further comprising: forming a first dielectric layer over the adhesion layer; and recessing the first dielectric layer and the adhesion layer to expose the top surface of the conductive via.

For another embodiment of the method, wherein forming the die pad over the die in the foundation layer, further comprises: forming the die over an adhesive layer in the foundation layer; depositing a molding layer over the die pad, the die, and the adhesive layer; and recessing the molding layer to expose a top portion of the die pad.

For one embodiment of the method, wherein the conductive via is coupled to the die pad by the exposed top portion of the die pad formed in the molding layer.

For one embodiment of the method, wherein removing the first photoresist layer and the second photoresist layer further comprises removing the second photoresist layer prior to removing the first photoresist layer.

For one embodiment of the method, wherein exposing the top surface of the conductive via includes a plasma etch, a mechanical grinding process, a mechanical polishing process or a chemical mechanical polishing process.

For one embodiment of the method, wherein recessing the portions of the exposed seed layer includes a wet etch or a dry etch process.

For one embodiment, the method further comprising forming a plurality of via openings. For one embodiment of the method, wherein the plurality of via openings are formed in the second photoresist layer with a single patterning process.

For one embodiment of the method, wherein the plurality of via openings are formed with a plurality of shapes or a plurality of sizes.

For one embodiment of the method, wherein the foundation layer comprises at least one of a substrate and a printed circuit board.

For one embodiment of the method, wherein the via opening has substantially vertical sidewalls, and wherein the conductive line opening has substantially vertical sidewalls.

For some embodiments, a foundation layer, comprising: an adhesive layer; a plurality of dies with a plurality of die pads formed over the adhesive layer; a molding layer formed over the plurality of die pads, the plurality of dies, and the adhesive layer, wherein the molding layer is recessed to expose top portions of the plurality of die pads; a plurality of first high density conductive vias formed over the plurality of die pads; a plurality of first high density conductive lines formed over the plurality of first high density conductive vias, the plurality of dies, and molding layer, wherein each of the first high density conductive lines is coupled to at least one of the plurality of first high density conductive vias; and a first high density dielectric layer formed over the plurality of first high density conductive vias, the plurality of dies, and the molding layer, wherein the plurality of first high density conductive lines are formed on the first high density dielectric layer.

For one embodiment of the foundation layer, wherein the plurality of high density conductive vias are formed by: a seed layer deposited over the plurality of die pads, the plurality of dies, and the mounding layer; a first photoresist layer deposited over the seed layer and the first photoresist layer patterned to form a plurality of conductive line openings over the plurality of die pads; a conductive material deposited into the plurality of conductive line openings to form a plurality of conductive lines; a second photoresist layer deposited over the first photoresist layer and the second photoresist layer patterned to form a plurality of via openings over the plurality of conductive lines; the conductive material deposited into the plurality of via openings to form the plurality of first high density conductive vias, wherein the conductive material only deposits on the portions of the exposed conductive lines, and wherein the second photoresist layer, the first photoresist layer, and portions of the exposed seed layer are removed; and one or more top surfaces of the plurality of first high density conductive vias are exposed on the first high density dielectric layer.

For one embodiment of the foundation layer, wherein the plurality of first high density conductive lines are coupled to the plurality of first high density conductive vias by the one or more top surfaces exposed on the first high density dielectric layer, and wherein each die pad is coupled to at least one of the plurality of first high density conductive lines.

For one embodiment, the foundation layer further comprising: a plurality of second high density conductive vias formed over the plurality of first high density conductive lines; a plurality of second high density conductive lines formed over the plurality of second high density conductive vias, wherein each of the second high density conductive lines is coupled to at least one of the plurality of second high density conductive vias; and a second high density dielectric layer formed over the plurality of first high density conductive lines and the plurality of second high density conductive vias, wherein the plurality of second high density conductive lines are formed on the second high density dielectric layer, and wherein the plurality of second high density conductive lines are coupled to the plurality of second high density conductive vias by one or more top surfaces exposed on the second high density dielectric layer.

For one embodiment, the foundation layer further comprising: a plurality of third high density conductive vias formed over the plurality of second high density conductive lines; a plurality of third conductive lines formed over the plurality of third high density conductive vias, wherein each of the third conductive lines is coupled to at least one of the plurality of third high density conductive vias; and a third high density dielectric layer formed over the plurality of second high density conductive lines and the plurality of third high density conductive vias, wherein the plurality of third conductive lines are formed on the third high density dielectric layer, and wherein the plurality of third conductive lines are coupled to the plurality of third high density conductive vias by one or more top surfaces exposed on the third high density dielectric layer.

For one embodiment, the foundation layer further comprising: a plurality of third conductive lines formed over the one or more vias, wherein the plurality of third conductive lines are coupled to the one or more vias; a second dielectric layer formed over the plurality of third conductive lines, the one or more vias, and the first dielectric layer; a plurality of connection pads formed over the plurality of third conductive lines and the second dielectric layer, wherein the plurality of connection pads are coupled to the plurality of third conductive lines, and the plurality of connection pads extend through the second dielectric layer; and a plurality of solder stops formed over the second dielectric layer, wherein the plurality of solder stops are formed between the plurality of connection pads.

For one embodiment, a method of forming a conductive via, the method comprising: forming a die pad over a foundation layer; depositing a first photoresist layer over the foundation layer and patterning the first photoresist layer to form a conductive line opening over the die pad; forming a conductive line in the conductive line opening; depositing a second photoresist layer over the first photoresist layer, the foundation layer, and the conductive line; patterning the second photoresist layer to form a via opening over the conductive line; depositing a conductive material into the via opening to form the conductive via, wherein the conductive material only deposits on the portions of the exposed conductive line; removing the first second layer and the first photoresist layer; forming a first dielectric layer over the foundation layer, the conductive line, and the conductive via, wherein a top surface of the first dielectric layer is formed above a top surface of the conductive via; and recessing the first dielectric layer to expose a top portion of the conductive via.

For one embodiment of the method, wherein forming the die pad over the foundation layer, further comprises: forming a die over an adhesive layer in the foundation layer; depositing a molding layer over the die pad, the die, and the adhesive layer; and recessing the molding layer to expose a top portion of the die pad.

For one embodiment of the method, wherein the conductive via is coupled to the die pad by the exposed top portion of the die pad formed in the molding layer.

For one embodiment of the method, wherein removing the first photoresist layer and the second photoresist layer further comprises removing the second photoresist layer prior to removing the first photoresist layer.

For one embodiment, the method further comprising forming an adhesion layer over the foundation layer, the conductive line, and the conductive via prior to forming the first dielectric layer.

For one embodiment, the method further comprising recessing the first dielectric layer and the adhesion layer to expose the top surface of the conductive via.

For one embodiment of the method, wherein the foundation layer comprises at least one of a substrate and a printed circuit board.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

What is claimed is:
1. A device, comprising:
a first die having a first plurality of die pads;
a second die having a second plurality of die pads;
a molding layer laterally around the first die and the second die and between the first die and the second die, the molding layer laterally around the first plurality of die pads and the second plurality of die pads, wherein the molding layer has a top surface co-planar with a top surface of the first plurality of die pads and with a top surface of the second plurality of die pads;
a plurality of conductive vias directly on and in contact with the first plurality of die pads and the second plurality of die pads; and
a plurality of conductive lines directly on and in contact with the top surface of the molding layer.

2. The device of claim 1, wherein the plurality of conductive vias comprise:
- a seed layer over the first plurality of die pads and the second plurality of die pads, and over the molding layer;
- a first photoresist layer over the seed layer and the first photoresist layer patterned to form a plurality of conductive line openings over the first plurality of die pads and the second plurality of die pads;
- a conductive material in the plurality of conductive line openings to form a plurality of first conductive lines;
- a second photoresist layer deposited over the first photoresist layer and the second photoresist layer patterned to form a plurality of via openings over the plurality of first conductive lines; and
- the conductive material deposited into the plurality of via openings to form the plurality of conductive vias, wherein the conductive material only deposits on the portions of the exposed plurality of first conductive lines, and wherein the second photoresist layer, the first photoresist layer, and portions of the exposed seed layer are removed.

3. The device of claim 1, wherein the plurality of conductive lines are coupled to the plurality of conductive vias.

4. The device of claim 3, further comprising:
- a plurality of second conductive vias over the plurality of conductive lines; and
- a plurality of second conductive lines over the plurality of second conductive vias, wherein each of the plurality of second conductive lines is coupled to at least one of the plurality of second conductive vias.

5. The device of claim 4, further comprising:
- a plurality of third conductive vias over the plurality of second conductive lines; and
- a plurality of third conductive lines over the plurality of third conductive vias, wherein each of the plurality of third conductive lines is coupled to at least one of the plurality of third conductive vias.

\* \* \* \* \*